US009237639B2

(12) United States Patent
Lee

(10) Patent No.: US 9,237,639 B2
(45) Date of Patent: Jan. 12, 2016

(54) MICROWAVE RESONANT CAVITY

(75) Inventor: Sang Hun Lee, San Ramon, CA (US)

(73) Assignee: Recarbon, Inc., Santa Clara, CA (US)

(*) Notice: Subject to any disclaimer, the term of this patent is extended or adjusted under 35 U.S.C. 154(b) by 102 days.

(21) Appl. No.: 14/125,038

(22) PCT Filed: Jun. 21, 2012

(86) PCT No.: PCT/US2012/043482
§ 371 (c)(1),
(2), (4) Date: Dec. 9, 2013

(87) PCT Pub. No.: WO2012/177834
PCT Pub. Date: Dec. 27, 2012

(65) Prior Publication Data
US 2014/0125215 A1 May 8, 2014

Related U.S. Application Data

(60) Provisional application No. 61/500,624, filed on Jun. 24, 2011.

(51) Int. Cl.
H01J 27/16 (2006.01)
H01J 27/18 (2006.01)
H05H 7/02 (2006.01)
H01J 37/32 (2006.01)
H01P 5/12 (2006.01)
H05H 1/46 (2006.01)

(52) U.S. Cl.
CPC ............ H05H 7/02 (2013.01); H01J 37/32247 (2013.01); H01P 5/12 (2013.01); H05H 1/46 (2013.01); H05H 2001/4622 (2013.01)

(58) Field of Classification Search
USPC .................. 313/231.01–231.71; 118/723 ER, 118/723 ME, 723 MW
See application file for complete search history.

(56) References Cited

U.S. PATENT DOCUMENTS

| 5,603,771 A * | 2/1997 | Seiberras et al. ...... 118/723 ME |
| 5,843,236 A * | 12/1998 | Yoshiki et al. ......... 118/723 MR |
| 6,198,224 B1 * | 3/2001 | Spitzl et al. ........... 118/723 MW |
| 7,921,804 B2 * | 4/2011 | Lee ........................ 118/723 MW |
| 2006/0021581 A1 * | 2/2006 | Lee et al. .............. 118/723 MW |

FOREIGN PATENT DOCUMENTS

| JP | 11-506805 A | 6/1999 |
| JP | 2003-518555 A | 6/2003 |
| JP | 4022590 B2 | 12/2007 |
| JP | 2010-540216 A | 12/2010 |

* cited by examiner

Primary Examiner — Mariceli Santiago
(74) Attorney, Agent, or Firm — Patent office of Dr. Chung Park

(57) ABSTRACT

A microwave resonant cavity is provided. The microwave resonant cavity includes: a sidewall having a generally cylindrical hollow shape; a gas flow tube disposed inside the sidewall and having a longitudinal axis substantially parallel to a longitudinal axis of the sidewall; a plurality of microwave waveguides, each microwave waveguide having a longitudinal axis substantially perpendicular to the longitudinal axis of the sidewall and having a distal end secured to the sidewall and aligned with a corresponding one of a plurality of holes formed on the sidewall; a top plate secured to one end of the sidewall; and a sliding short circuit having: a disk slidably mounted between the sidewall and the gas flow tube; and at least one bar disposed inside the sidewall and arranged parallel to the longitudinal axis of the sidewall.

12 Claims, 5 Drawing Sheets

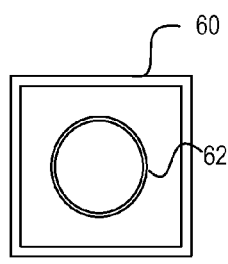 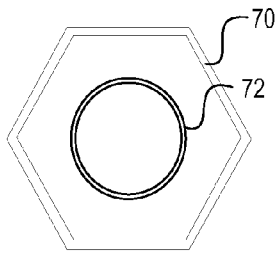 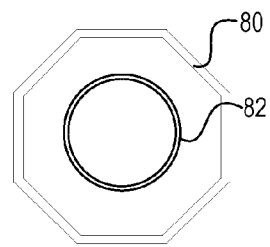
FIG. 3A          FIG. 3B          FIG. 3C
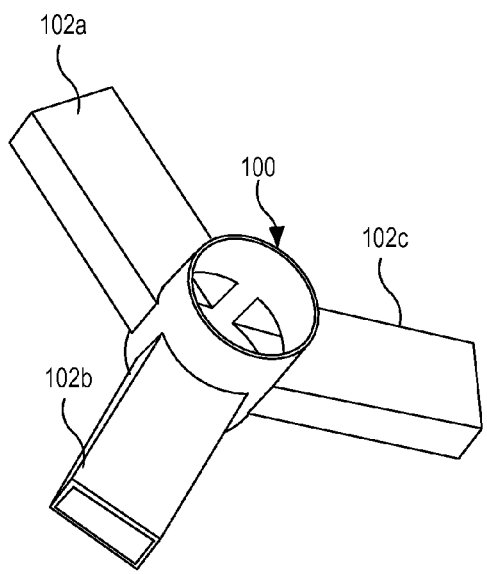
FIG. 4A

MICROWAVE RESONANT CAVITY

CROSS-REFERENCE TO PRIOR APPLICATIONS

This application is a national Stage Patent Application of PCT International Patent Application No. PCT/US2012/043482, which was filed on Jun. 21, 2012 under 35 U.S.C. §371 and claims priority of both U.S. Patent Application No. 61/500,624, filed on Jun. 24, 2011 and U.S. patent application Ser. No. 13/529,110, filed on Jun. 21, 2012, which are all hereby incorporated by reference in their entirety.

BACKGROUND OF THE INVENTION

The present invention relates to plasma generators, and more particularly to systems having a resonant cavity for generating a plasma therein.

In recent years, microwave technology has been applied to generate various types of plasma. In some applications, igniting and sustaining plasma requires a high power microwave generator. The existing microwave techniques are not suitable, or at best, highly inefficient due to one or more of the following drawbacks. First, the existing systems lack proper scalability, where scalability refers to the ability of a system to handle varying amounts of microwave input power in a graceful manner or its ability to be enlarged/reduced to accommodate the variation of the input power. For instance, the required microwave input power may vary depending on the types, pressure, and flow rates of the gas to be converted into plasma. Second, the economics of scale for a magnetron increases rapidly as the output power increases. For instance, the price of a 10 KW magnetron is much higher than the price of ten 1 KW magnetrons. Thus, there is a need for a plasma generating system that has high scalability and is cheaper than currently available plasma generating systems without compromising the output power.

SUMMARY OF THE INVENTION

In one embodiment of the present disclosure, a microwave resonant cavity includes: a sidewall having a generally cylindrical hollow shape and formed of a material opaque to a microwave; a gas flow tube disposed inside the sidewall, formed of a material transparent to a microwave, and having a longitudinal axis substantially parallel to a longitudinal axis of the sidewall; a plurality of microwave waveguides, each said microwave waveguide having a longitudinal axis substantially perpendicular to the longitudinal axis of the sidewall and having a distal end secured to the sidewall and aligned with a corresponding one of a plurality of holes formed on the sidewall; a top plate formed of a material opaque to a microwave and secured to one end of the sidewall; and a sliding short circuit. The sliding circuit includes: a disk formed of a material opaque to a microwave and slidably mounted between the sidewall and the gas flow tube, the disk having an outer rim snuggly fit into the sidewall and a hole into which the gas flow tube being snuggly fit; and at least one bar disposed inside the sidewall and arranged parallel to the longitudinal axis of the sidewall. By moving the bar along the longitudinal direction of the sidewall, the space defined by the top plate, sidewall, and the disk is adjusted to form a microwave resonant cavity inside the gas flow tube.

BRIEF DESCRIPTION OF THE DRAWINGS

FIGS. 3A-3C are top views of alternative embodiments of the microwave resonant cavity in FIG. 2.

FIGS. 4A-4C are perspective views of alternative embodiments of the microwave resonant cavity in FIG. 1.

DETAILED DESCRIPTION OF THE PREFERRED EMBODIMENTS

Figure 1:
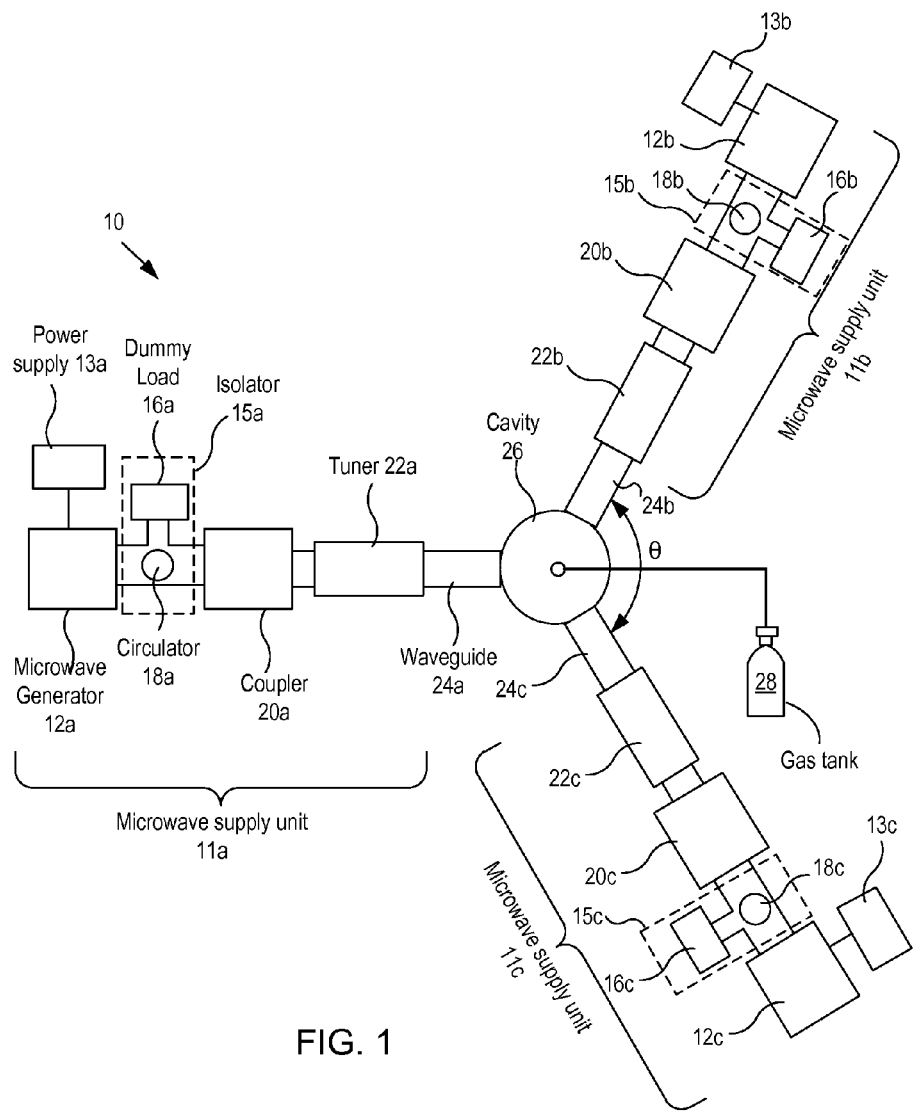
FIG. 1 is a schematic diagram of a plasma generating system in accordance with one embodiment of the present invention.

FIG. 1 is a schematic diagram of a system 10 for generating microwave plasma in accordance with one embodiment of the present invention. As illustrated, the system 10 may include: a microwave resonant cavity 26; microwave supply units 11a-11c for providing microwaves to the microwave resonant cavity 26; and waveguides 24a-24c for transmitting microwaves from the microwave supply units 11a-11c to the microwave resonant cavity 26, where the microwave resonant cavity 26 receives a gas and/or gas mixture from a gas tank 28 or another source such as flue gas.

The microwave supply unit 11a provides microwaves to the microwave resonant cavity 26 and may include: a microwave generator 12a for generating microwaves; a power supply 13a for supplying power to the microwave generator 12a; and an isolator 15a having a dummy load 16a for dissipating reflected microwaves that propagate toward the microwave generator 12a and a circulator 18a for directing the reflected microwaves to the dummy load 16a.

In one embodiment, the microwave supply unit 11a further includes a coupler 20a for measuring fluxes of the microwaves; and a tuner 22a for reducing the microwaves reflected from the microwave resonant cavity 26. The components of the microwave supply unit 11a shown in FIG. 1 are well known and are listed herein for exemplary purposes only. Also, it is possible to replace the microwave supply unit 11a with a system having the capability to provide microwaves to the microwave resonant cavity 26 without deviating from the present invention. A phase shifter may be mounted between the isolator 15a and the coupler 20a.

The microwave supply units 11b and 11c are shown to have similar components as the microwave supply units 11a. However, it is noted that the microwave supply units 11b and 11c may have components different from those of the unit 11a, insofar as they can generate and deliver microwaves to the waveguides 24b and 24c, respectively.

Figure 2:
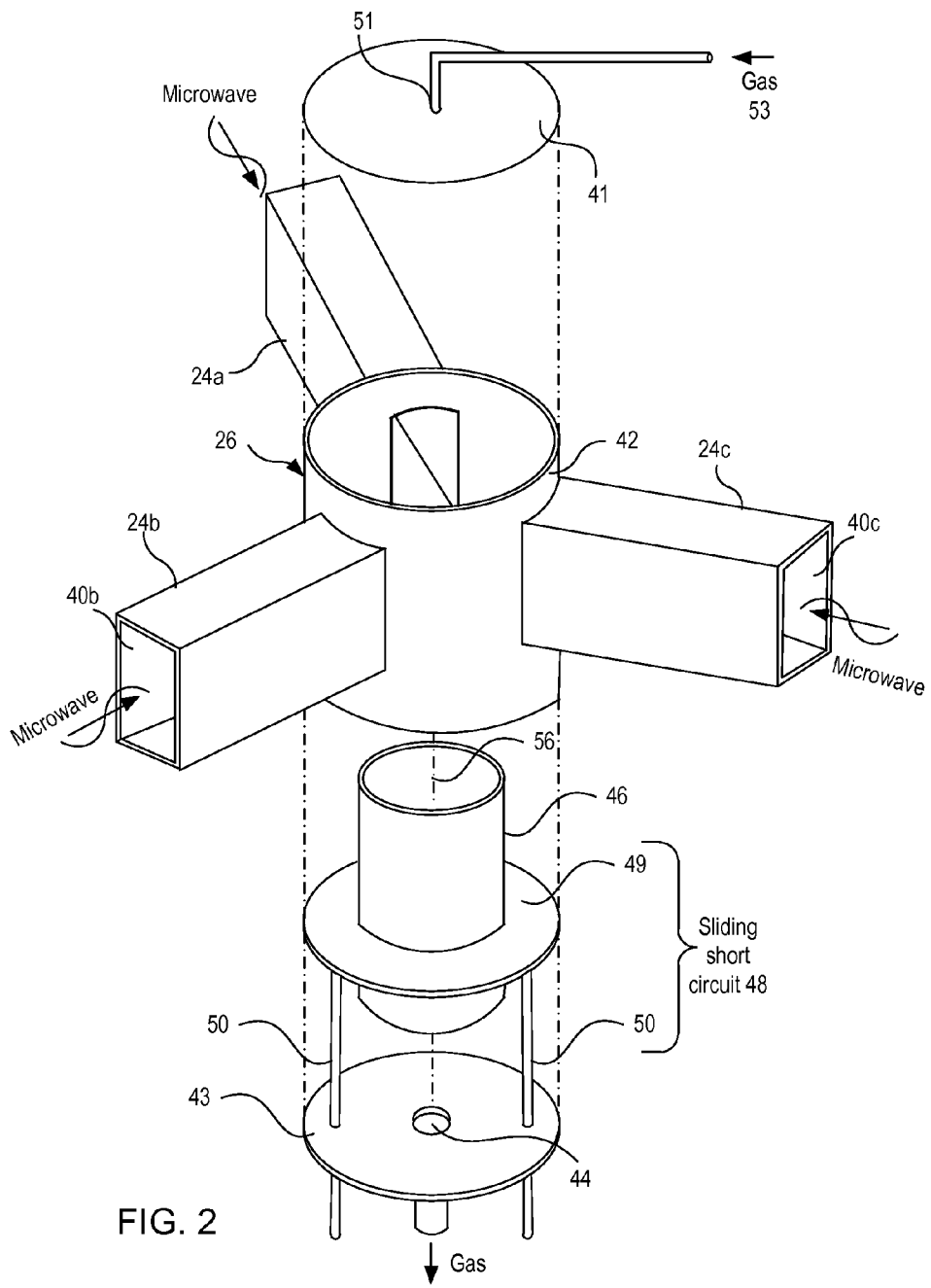
FIG. 2 is an exploded perspective view of the microwave resonant cavity in FIG. 1.

FIG. 2 is an exploded perspective view of the microwave resonant cavity 26 in FIG. 1. As depicted, the microwave resonant cavity (shortly, cavity hereinafter) 26 includes a top plate 41 having an inlet port 51 for receiving gas 53 from the gas tank 28; a bottom plate 43 having an outlet port (or, outlet hole) 44 for discharging gas therethrough; and a sidewall 42 connected to the distal ends of the waveguides 24a-24c. The distal end of the waveguide 24a is secured to the sidewall 42 so that the microwave energy flowing through the proximal end 40a of the waveguide 24a enters into the sidewall 42. Likewise, the microwave energy flowing through the proximal ends 40b and 40c of the waveguides 24b and 24c enters the sidewall 42. The top plate 41, sidewall 42, and bottom plate 43 may be formed of any suitable material, such as metal, that is opaque to the microwave. The cavity 26 also includes a gas flow tube 46 that is transparent to the microwave and preferably formed of quartz.

The top and bottom ends of the gas flow tube 46 are sealed to the top plate 41 and the bottom plates 43 of the cavity 26, respectively, so that the gas entered into the tube 46 through the inlet port 51 is excited into plasma and exits through the outlet port 44 of the bottom plate 43. The microwave energy received through the waveguides 24a-24c excites the gas into plasma when the gas flows through the gas flow tube 46.

The cavity 26 may also include a sliding short 48 having a disk 49 and bars 50. The disk 49 is dimensioned to slidably fit into the space between the inner surface of the sidewall 42 and the outer surface of the gas flow tube 46, and formed of material opaque to the microwave, preferably metal. During operation, the microwaves discharged from the distal ends of the waveguides 24a-24c form an interference pattern in the gas flow tube 46. As the user slides the bars 50 up and down along the longitudinal direction 56 of the cavity 26, the distance between the disk 49 and the top plate 41 is changed so that the interference generates a peak amplitude region in the gas flow tube 46, i.e., the impedance matching may be obtained by adjusting the location of the disk 49 relative to the top plate 41. It is noted that the bars may be attached to a suitable tuning mechanism, such as a micrometer fixed to the outer surface of the bottom plate 43 so that the user can tune the impedance at high precision Optionally, a motor attached to the bars 50 may be used for an automated control.

It is noted that the microwaves generated by the three microwave supply units 11a-11c are combined in the gas flow tube 46. As such, if the microwave supply units are identical, the maximum intensity of microwave field within the gas flow tube 46 would be the same as the intensity generated by one microwave supply unit that has the output power three times as large as the microwave supply unit 11a. This feature provides two advantages; scalability and cost reduction in manufacturing a microwave supply unit. The operator of the system 10 may selectively turn on the microwave supply units 11a-11c so that the intensity of the microwave field in the gas flow tube 46 may be varied. For instance, the microwave intensity for igniting the plasma in the gas flow tube 46 may vary depending on the types of gas 53. The operator may optimize the microwave intensity in the gas flow tube 46 by selectively turning on the microwave supply units 11a-11c. It is noted that the system 10 has only three microwave supply unit. However, it should be apparent to those of ordinary skill in the art that the system may include any other suitable number of microwave supply units.

The price of the microwave generator 12a, especially the magnetron, increases rapidly as its power output increases. For instance, the price of ten magnetrons of the commercially available microwave oven is considerably lower than that of one high power magnetron which has an output power ten times that of the microwave oven. Thus, the multiple microwave generators feature of the system 10 allows the designer to build a low cost microwave generating system without compromising the total maximum power.

FIGS. 3A-3C are top views of alternative embodiments 60, 70, and 80 of the cavity sidewall 42 in FIG. 2. As depicted, the sidewall may have a suitable polygonal shape, such as rectangle, hexagon, or octagon, where a waveguide may be fixed to each side of the polygon. The phases of the microwaves exiting from two adjacent waveguides may be differentiated so that the interference between the microwaves generates the maximum intensity in the gas flow tubes 62, 72, and 82. It is noted that gas flow tubes 62, 72, and 82 may have other suitable cross sectional geometry, such as rectangle, hexagon, or octagon. It is further noted that the angle θ (shown in FIG. 1) between two adjacent waveguides may be adjusted to optimize the interference between two microwaves.

FIG. 4A is a perspective view of an alternative embodiment 100 of the cavity 26 in FIG. 1. For brevity, only the sidewall and waveguides are show in FIG. 4A. As depicted, the cavity 100 is similar to the cavity 26 in FIG. 1, with the difference that the waveguides 102a-102c are e-plane waveguides.

Figure 4B:
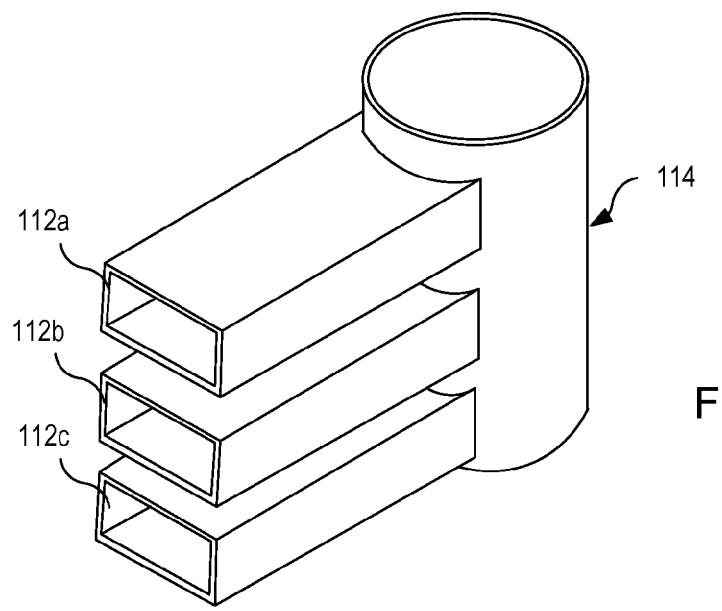
Figure 4C:
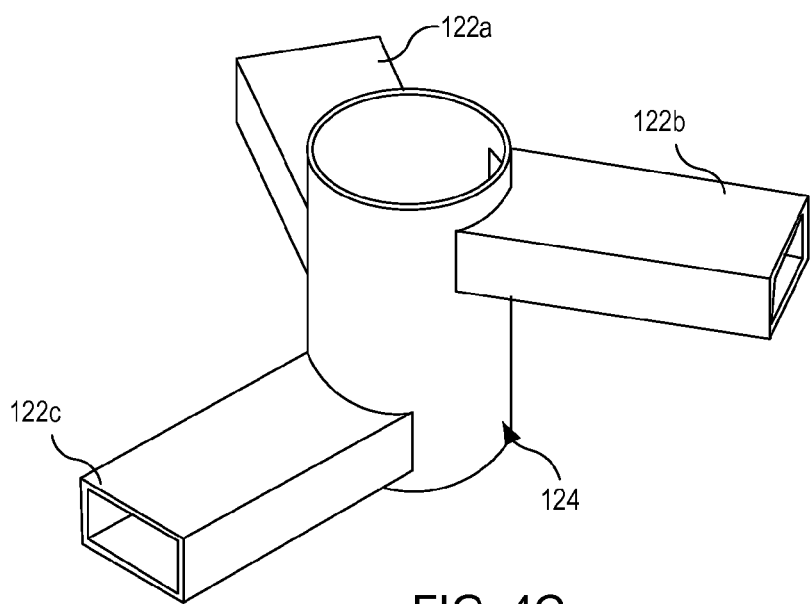

FIGS. 4B and 4C are perspective views of alternative embodiments 114 and 124 of the cavity 26 in FIG. 1. As depicted, the cavities 114 and 124 are similar to the cavity 26, with the differences that the locations of the waveguides 112a-112c and 122a-122c relative to the sidewalls of the cavities 114 and 124 are different. The locations of the waveguides are determined to optimize the interference pattern in the gas flow tubes (not shown in FIGS. 4B-4C for brevity) disposed within the cavities 114 and 124.

Figure 5:
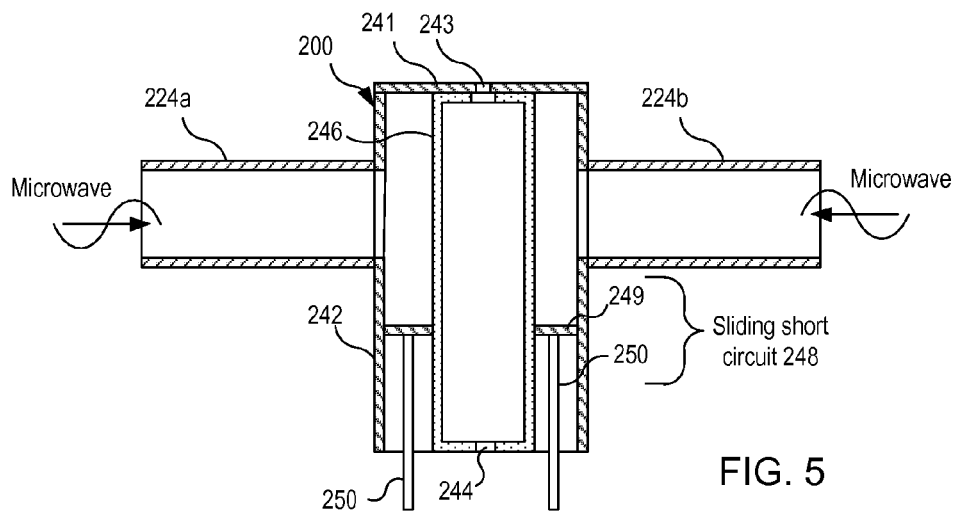
FIG. 5 is a schematic cross sectional view of an alternative embodiment of the microwave resonant cavity in FIG. 2.

FIG. 5 is a schematic cross sectional view of an alternative embodiment 200 of the microwave resonant cavity 26 in FIG. 2. As depicted, the cavity 200 includes a top plate 241 having an inlet hole 243 for receiving gas from the gas tank 28 (not shown in FIG. 5); a sidewall 242 connected to the distal ends of the waveguides 224a-224b; a gas flow tube 246 having a bottom hole 244 for discharging gas therethrough; and sliding short circuit 248 having a disk 249 and bars 250. Since the materials and functions of the components of the cavity 200 are similar to those of their counterparts of the cavity 26, the detailed description is not repeated. The difference between the cavities 26 and 200 is that the cavity 200 does not have a bottom plate while the cavity 26 includes the bottom plate 43.

Figure 6:
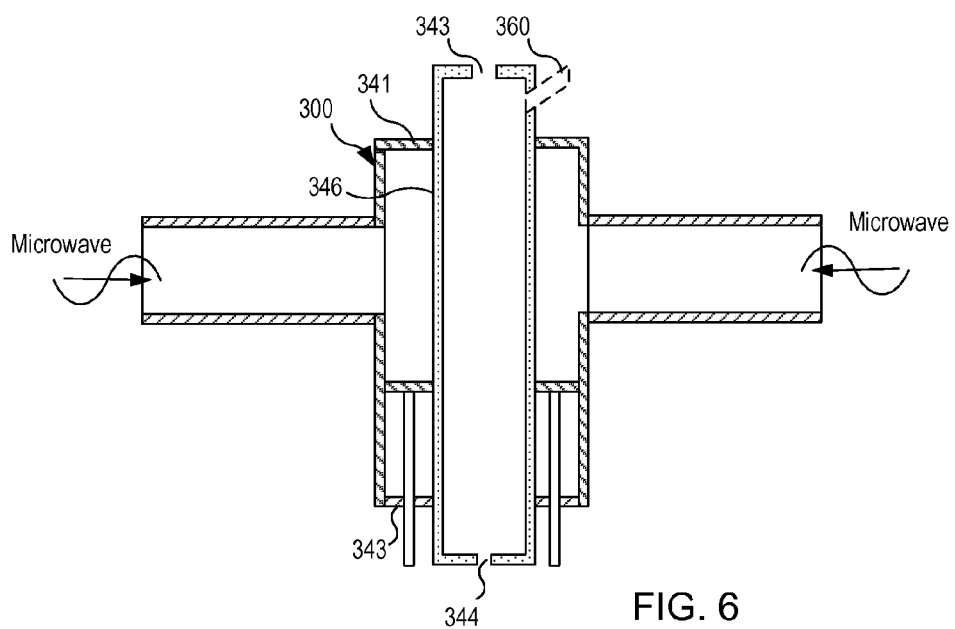
FIG. 6 is a schematic cross sectional view of an alternative embodiment of the microwave resonant cavity in FIG. 2.

FIG. 6 is a schematic cross sectional view of an alternative embodiment 300 of the cavity 26 in FIG. 2. As depicted, the cavity 300 is similar to the cavity 26, with the difference that the top and bottom portions of the gas flow tube 346 protrude outside the top plate 341 and the bottom plate 343, respectively. The gas flow tube 346 includes a top hole 343 and a bottom hole 344 for receiving and discharging the gas therethrough. Alternatively, the gas flow tube 360 may have a gas inlet port 360 in place of the hole 343, where the inlet port 360 is angled with respect to the longitudinal axis of the gas flow tube 346 to impart swirling motion to the injected gas.

It should be understood, of course, that the foregoing relates to exemplary embodiments of the invention and that modifications may be made without departing from the spirit and scope of the invention as set forth in the following claims.

What is claimed is:

1. A microwave resonant cavity, comprising:
    a sidewall having a generally cylindrical hollow shape and formed of a material opaque to a microwave;
    a gas flow tube disposed inside the sidewall, formed of a material transparent to a microwave, and having a longitudinal axis substantially parallel to a longitudinal axis of the sidewall;
    a plurality of microwave waveguides, each said microwave waveguide having a longitudinal axis substantially perpendicular to the longitudinal axis of the sidewall and having a distal end secured to the sidewall and aligned with a corresponding one of a plurality of holes formed on the sidewall;
    a top plate formed of a material opaque to a microwave and secured to one end of the sidewall; and
    a sliding short circuit including:
        a disk formed of a material opaque to a microwave and slidably mounted between the sidewall and the gas flow tube, the disk having an outer rim snuggly fit into the sidewall and a hole into which the gas flow tube being snuggly fit; and
        at least one bar disposed inside the sidewall and arranged parallel to the longitudinal axis of the sidewall, whereby a space defined by the top plate, sidewall, and the disk is adjusted to form a microwave resonant cavity inside the gas flow tube by moving the bar along the longitudinal direction of the sidewall.

2. A microwave resonant cavity as recited in claim 1, wherein one end of the gas flow tube abuts the top plate and the top plate has a hole for receiving a gas that flows through the gas flow tube.

3. A microwave resonant cavity as recited in claim 1, further comprising:
   a bottom plate secured to an other end of the sidewall and having at least one hole through which the bar passes through.

4. A microwave resonant cavity as recited in claim 3, wherein the bottom plate has a gas outlet.

5. A microwave resonant cavity as recited in claim 1, wherein the gas flow tube passes through the top plate.

6. A microwave resonant cavity as recited in claim 1, wherein the distal ends of the plurality of microwave waveguides are disposed at a same height along the longitudinal axis of the sidewall.

7. A microwave resonant cavity as recited in claim 1, wherein the distal ends of the plurality of microwave waveguides are disposed at different heights along the longitudinal axis of the sidewall.

8. A microwave resonant cavity as recited in claim 1, wherein a cross sectional shape of the sidewall is one selected from the group consisting of circle, rectangle, hexagon, and octagon.

9. A microwave resonant cavity as recited in claim 1, wherein the longitudinal axes of the plurality of microwave waveguides are disposed on a same plane parallel to the longitudinal axis of the sidewall.

10. A microwave resonant cavity as recited in claim 1, further comprising:
    a microwave supply unit coupled to a proximal end of each said microwave waveguide.

11. A microwave resonant cavity as recited in claim 10, wherein the microwave supply unit includes:
    a microwave generator for generating microwaves; and
    an isolator having a dummy load for dissipating microwaves that propagate toward the microwave generator and a circulator directing the microwaves to the dummy load.

12. A microwave resonant cavity as recited in claim 11, wherein the microwave supply unit further includes:
    a coupler for measuring a flux of microwaves; and
    a tuner for reducing reflection of microwaves.

* * * * *